(12) United States Patent
Tan (10) Patent No.: US 10,763,241 B2
(45) Date of Patent: Sep. 1, 2020

(54) STACKED PACKAGE STRUCTURE AND STACKED PACKAGING METHOD FOR CHIP

(71) Applicant: Silergy Semiconductor Technology (Hangzhou) LTD, Hangzhou, ZheJiang Province (CN)

(72) Inventor: Xiaochun Tan, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/283,573

(22) Filed: Oct. 3, 2016

(65) Prior Publication Data

US 2017/0110441 A1    Apr. 20, 2017

(30) Foreign Application Priority Data

Oct. 15, 2015    (CN) .......................... 2015 1 0665364

(51) Int. Cl.
*H01L 27/04*    (2006.01)
*H01L 25/065*    (2006.01)
*H01L 23/31*    (2006.01)
*H01L 25/00*    (2006.01)
(Continued)

(52) U.S. Cl.
CPC ...... *H01L 25/0657* (2013.01); *H01L 23/3121* (2013.01); *H01L 24/19* (2013.01); *H01L 25/03* (2013.01); *H01L 25/50* (2013.01); *H01L 2224/04105* (2013.01); *H01L 2224/12105* (2013.01); *H01L 2224/16225* (2013.01); *H01L 2224/16227* (2013.01); *H01L 2224/32225* (2013.01); *H01L 2224/73267* (2013.01);
(Continued)

(58) Field of Classification Search
None
See application file for complete search history.

(56) References Cited

U.S. PATENT DOCUMENTS

2003/0102489 A1    6/2003    Nam
2004/0262774 A1    12/2004    Kang et al.
2005/0275061 A1    12/2005    Ohguro
(Continued)

FOREIGN PATENT DOCUMENTS

| CN | 101241904 A | 8/2008 |
|----|-------------|--------|
| CN | 101615609 A | 12/2009 |
| CN | 201804913 U | 4/2011 |

*Primary Examiner* — Joseph C. Nicely
*Assistant Examiner* — Lamont B Koo
(74) *Attorney, Agent, or Firm* — Michael C. Stephens, Jr.

(57) ABSTRACT

A stacked package structure for a chip, can include: a substrate having a first surface and a second surface opposite thereto; a first die having an active and back faces, where the active face of the first die includes pads; a first enclosure that covers the first die; an interlinkage that extends to the first enclosure to electrically couple with the pads; a first redistribution body electrically coupled to the interlinkage, and being partially exposed on a surface of the stacked package structure to provide outer pins for electrically coupling to external circuitry; a penetrating body that penetrates the first enclosure and substrate; a second die having an electrode electrically coupled to a first terminal of the penetrating body; and a second terminal of the penetrating body that is exposed on the surface of the stacked package structure to provide outer pins for electrically coupling to the external circuitry.

19 Claims, 4 Drawing Sheets

(51) Int. Cl.
*H01L 25/03* (2006.01)
*H01L 23/00* (2006.01)

(52) U.S. Cl.
CPC ............... *H01L 2224/92244* (2013.01); *H01L 2225/06527* (2013.01); *H01L 2225/06572* (2013.01)

(56) References Cited

U.S. PATENT DOCUMENTS

| | | |
|---|---|---|
| 2006/0291029 A1 | 12/2006 | Lin et al. |
| 2008/0136004 A1* | 6/2008 | Yang ..................... H01L 24/96 257/686 |
| 2009/0039869 A1 | 2/2009 | Williams |
| 2010/0071944 A1 | 3/2010 | Endo |
| 2011/0031619 A1* | 2/2011 | Chen ..................... H01L 21/563 257/738 |
| 2011/0134613 A1 | 6/2011 | Moussaoui |
| 2011/0298528 A1 | 12/2011 | Endo |
| 2012/0322202 A1 | 12/2012 | Nishimura |
| 2013/0087910 A1* | 4/2013 | Abdul Razak .......... H01L 24/14 257/737 |
| 2013/0187268 A1* | 7/2013 | Lin ................... H01L 23/49827 257/737 |
| 2013/0299957 A1 | 11/2013 | Kobayashi et al. |
| 2014/0070403 A1 | 3/2014 | Pan et al. |
| 2014/0103488 A1* | 4/2014 | Chen ................... H01L 23/5389 257/532 |

* cited by examiner

STACKED PACKAGE STRUCTURE AND STACKED PACKAGING METHOD FOR CHIP

RELATED APPLICATIONS

This application claims the benefit of Chinese Patent Application No. 201510665364.6, filed on Oct. 15, 2015, which is incorporated herein by reference in its entirety.

FIELD OF THE INVENTION

The present disclosure generally relates to the field of chip packaging, and more particularly to stacked chip package structures and associated manufacturing methods.

BACKGROUND

Integrated circuit dice are typically packaged prior to being integrated with other electrical elements or devices in the manufacturing process. The package structure may at least provide sealing of dice, as well as provide electrical connectivity ports to external circuitry. For example, the package structure can provide electrical connectivity between dice and base board of electrical or electronic products, protection from pollution, mechanical support, heat dissipation, and also may reduce heat mechanical strain.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Connections between dice or integrated circuits and pins of a package structure is an essential portion of achieving input and output connections between dice and external circuitry. Stacked chip packaging techniques are becoming more widely used, in order to reduce the size of an integrated circuit. In some cases, bonding wires can be used to achieve such connectivity. High purity thin metal wire (e.g., gold wire, copper wire, aluminum wire, etc.) can be employed to connect pads of dice to a leadframe or printed-circuit board (PCB). However, there may be drawbacks associated with the employment of bonding wires, such as pad cratering, tail inconformity, bending fatigue, vibration fatigue, breakage, and disconnection.

Stacked packaging techniques continue to develop so as to meet the requirements and challenges of various semiconductor processes, and new materials based on the relationship of manufacturing and packaging. Thus, more stable and reliable packaging methods may be developed in order to connect internal chips with external pins. However, heat dissipation, package size, and package height may be compromised in some cases.

In one embodiment, a stacked package structure for a chip, can include: (i) a substrate having a first surface and a second surface opposite thereto; (ii) a first die having an active face and a back face opposite thereto, where the first die is arranged above the first surface of the substrate, the back face of the first die is relatively close to the first surface of the substrate, and the active face of the first die includes pads; (iii) a first enclosure that covers the first die; (iv) at least one interlinkage that extends to the first enclosure to electrically couple with the pads; (v) at least one first redistribution body electrically coupled to the interlinkage, and being partially exposed on a surface of the stacked package structure to provide outer pins for electrically coupling to external circuitry; (vi) at least one penetrating body that penetrates the first enclosure and the substrate; (vii) a second die having at least one electrode electrically coupled to a first terminal of the penetrating body; and (viii) a second terminal of the penetrating body that is at least partially exposed on the surface of the stacked package structure to provide outer pins for electrically coupling to the external circuitry.

Figure 1:
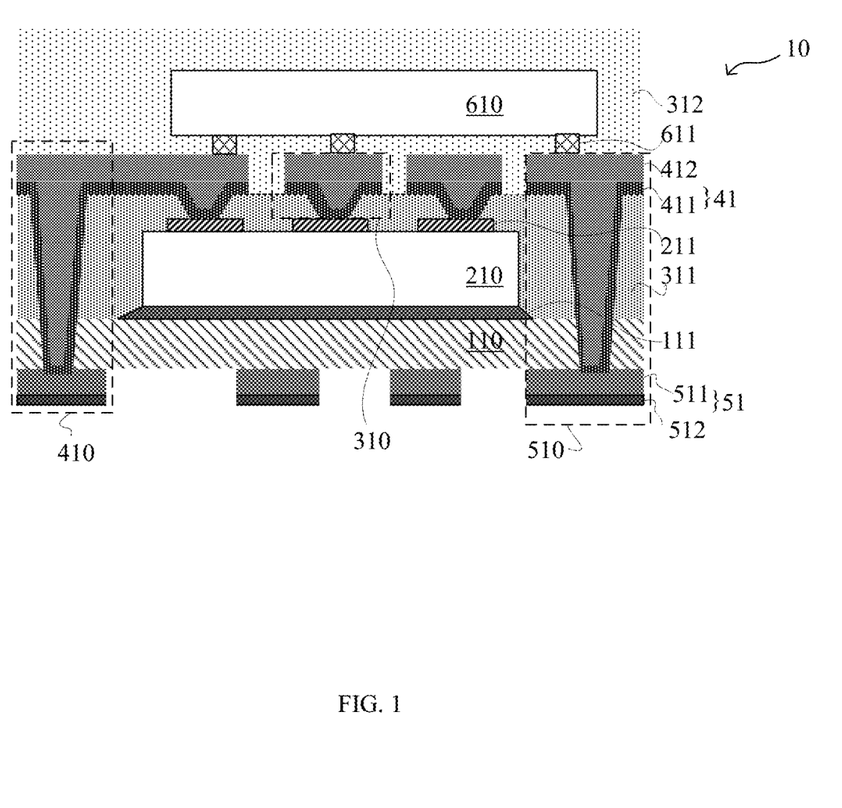
FIG. 1 is a cross-sectional view diagram of a first example stacked package structure, in accordance with embodiments of the present invention.

In particular embodiments, a stacked package structure can utilize an interlinkage, a redistribution body, and a penetrating body, without bonding wires, in order to achieve electrical conductivity between pads and a leadframe or PCB board. Referring now to FIG. 1, shown is a cross-sectional view diagram of a first example stacked package structure, in accordance with embodiments of the present invention. Package structure 10 can include substrate 110, die 210, enclosure 311, spaced interlinkages 310, redistribution bodies 410, spaced penetrating bodies 510, and die 610. Substrate 110 may include semiconducting material (e.g., silicon, germanium, indium antimonide, gallium arsenide, indium arsenide, gallium nitride, etc.), insulating material (e.g., epoxy resin, polyester glass fiber, silicon dioxide, polytetrafluorethylene, glass, ceramic, etc.), or various combinations thereof.

Package substrate 110 may include "first" and "second" surfaces. Dice 210 and 610 may each include an active face and a back face opposite thereto. Device layers of die 210 and die 610 may lie on the active face, and the device layer may include a transistor, and other devices (e.g., resistors, capacitors, inductors, etc.). A plurality of metal layers may lie above the device layer. Each of the metal layers may include metal interlinkages made from copper, and through holes for electrical connections between the metal interlinkages. The metal interlinkages and through holes can be surrounded by insulated interlayer dielectric. A plurality of pads may be arranged above the metal layers. For example, pad 211 can be located on the active face of die 210, while pads on die 610 are not shown in the diagram.

Die 210 may be arranged above the first surface of substrate 110. For example, the back face of die 210 can be relatively close to the first surface of substrate 110, and may be pasted to the first surface of substrate 110 via adhesive layer 111. Adhesive layer 111 may be insulating glue, or Au—Si alloy, Pb—Sn alloy, Sn—Ag—Cu alloy, and/or conductive glue (e.g., conductive glue with conductive particles, dispersant added into the base of the epoxy resin, etc.). Enclosure 311 may be formed above the first surface of die 210 and substrate 110 for covering and protecting die 210 from being damaged and polluted. Enclosure 311 may be formed by any suitable type of material (e.g., ceramic, epoxy resin, etc.). Enclosure 311 can be provided with a plurality of "first" openings corresponding to pads 211, in order to expose pad 211. For example, laser etching or mechanical drilling may be employed to form such first openings.

Interlinkages 310 may be used to lead out electrodes of die 210. Each of interlinkages 310 can be extended into enclosure 311, so as to electrical coupled to pad 211 of die 210. In this example, each of the interlinkages 310 may include a "first" portion extending on the surface of 311, and a "second" portion of enclosure 311 extending to a corresponding pad 211. Redistribution body 410 may be used to redistribute positions of electrodes on the interlinkages 310. Each of redistribution body 410 can be electrically coupled to one interlinkage 310 and partially exposed on the surface of stacked package structure 10, and may be used as outer pins for providing external electrical connectivity.

In this particular example, redistribution body 410 may include a first portion extending on the surface of enclosure 311, a second portion extending from the surface of enclosure 311 to the second surface of substrate 110, and a "third" portion extending on the second surface of substrate 311. The first portion of redistribution body 410 can be extended to the first portion of interlinkage 310, in order to achieve electrical connection with interlinkage 310. The third portion of redistribution body 410 may be partially exposed on the surface of stacked package structure 10, to serve as outer pins for external electrical connectivity. Thus, die 210 can be electrically coupled external circuitry.

Each of the penetrating bodies 510 may penetrate enclosure 311 and substrate 110. The first terminal of penetrating body 510 may be electrically coupled to die 610, and the second terminal can be partially exposed on the surface of the stacked package structure as outer pins for electrically coupling to external circuitry. Thus, die 610 may be electrically coupled to such external circuitry. In this particular example, the first terminal of penetrating body 510 can extend on the surface of enclosure 311, the second terminal may extend on the second surface of substance 110, and the mid-section can extend from the surface of enclosure 311 to the second surface of substrate 110.

The active face of die 610 can face enclosure 311, and at least one electrode on die 610 may be electrically coupled to the first terminal of penetrating body 510 via conductive bump 611. In this way, the electrodes on die 610 may be lead out to the surface of stacked package structure 610 via penetrating body 510, for electrically coupling to external circuitry. At least one electrode on die 610 can be electrically coupled to the first portion of interlinkage 310 via conductive bump 611, so as to electrically couple the electrodes of die 210 and die 610 inside stacked package structure 10. In this way, the number of outer pins of the stacked package structure can be reduced.

In other examples, die 610 may be packaged by wire bonding, such as the back face of die 610 may be relatively close to and above the first portion of interlinkage 310. For example, the back face of die 610 may be pasted on interlinkage 310 via insulation glue. At least one electrode on die 610 can be electrically coupled to the first terminal of penetrating body 510 via conductive wires. In this way, the electrodes on die 610 may lead to the surface of the stacked package structure through the second terminal of penetrating body 510, in order to provide outer pins for electrically coupling to external circuitry. Moreover, at least one electrode on die 610 may be coupled to the first portion of interlinkage 310 through conductive wires, so as to electrically couple die 110 with die 610 inside stacked package structure 10.

The first and second portions of interlinkage 310, the first to third portions of redistribution body 410, the first and second terminals of penetrating body 510 as well as the mid-section thereof, may be made from the same or different conducting materials. In some cases, one or more such portions may be selectively made from the same materials at substantially the same time. For example, the first and second portions of interlinkage 310, the first and second portions of redistribution body 410, the first terminal and the mid-section of penetrating body 510 can be formed by a patterned conducting layer. For example, conducting layer 41 may include a first portion extending on the surface of the first enclosure, a second portion extending from the surface of enclosure 311 to the inside and electrically coupling to pad 211, and a third portion extending from the surface of enclosure 311 to the second surface of substrate 110. Conducting layer 41 may include metal layer 411, and metal layer 412 located above metal layer 411. Metal layers 411 and 412 may be formed from any appropriate metal materials (e.g., Ni, Al, Ti, W, Pt, Cu, Au, Co, Ta, etc.) or alloy materials (e.g., TiN, TiW, etc.).

For example, conducting layer 41 may be formed by forming a plurality of first openings that extend from the surface of enclosure 311 to pads 211, and a plurality of second openings that extend from the surface of enclosure 311 to substrate 110 by laser etching or mechanical drilling. In some cases, conducting layer 51 may be patterned on the second surface of substrate 110 prior to forming the openings, so as to form the third portion of redistribution body 410 and the second terminal of penetrating body 510. Conducting layer 51 can be partially exposed on the surface of stacked package structure 10, in order to provide outer pins for electrically coupling to external circuitry. Conducting layer 51 may include metal layer 511 formed on the second surface of substrate 110, and solder layer 512 located on metal layer 511. Solder layer 512 may be formed from solder materials, such as W. Solder layer 512 may be used to electrically couple to the lead frame, PCB, or other electronic devices. Metal layers 411, 412, and 511 may be made from any appropriate metal materials (e.g., Ni, Al, Ti, W, Pt, Cu, Au, Co, Ta, etc.) or alloy materials (e.g., TiN, TiW, etc.).

Stacked package structure 10 may also include enclosure 312 that can protect the stacked package structure from being damaged and/or polluted by covering die 610. Enclosures 311 and 312 may be made from different types of materials (e.g., ceramic, epoxy resin, etc.). In certain embodiments, the stacked package structure may be adapted to a chip package with a relatively high space density between pads, by firstly leading out the electrodes via the interlinkages and the first redistribution bodies when packaging the first die. In such a case, the bonding wires may not be needed and the package resistors can be reduced. Secondly, leading out the electrodes on the second die via the penetrating bodies that penetrates the first enclosure and the substrate in a similar way after packaging the first die, so as to package the chip in a stack with reduced packaging size and fewer pins.

Figure 2:
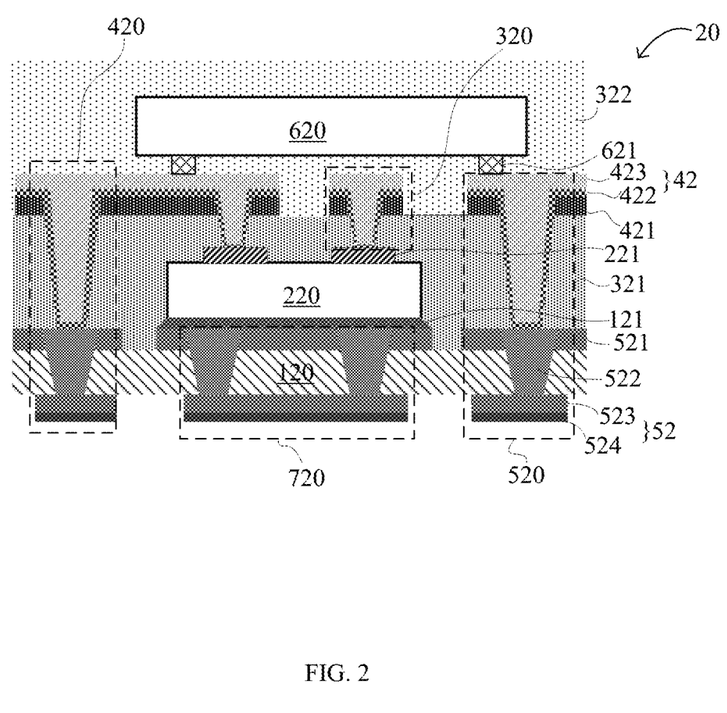
FIG. 2 is a cross-sectional view diagram of a second example stacked package structure, in accordance with embodiments of the present invention.

Referring now to FIG. 2, shown is a cross-sectional view diagram of a second example stacked package structure, in accordance with embodiments of the present invention. Stacked package structure 20 can include substrate 120, die 220, enclosure 321, spaced interlinkages 320, enclosure 322, spaced redistribution bodies 420, spaced penetrating bodies 520, die 620, patterned conducting layer 521, and at least one redistribution body 720. In this particular example, stacked package structure 20 can also include conducting layer 521 and redistribution body 720. Patterned conducting layer 521 can be formed on the first surface of the substrate 120. The back face of die 220 may be electrically coupled to conducting layer 521 via conductive stick glue 121, such that the electrodes on the back face of die 220 are lead to conducting layer 521.

In some cases, interlinkage 320 may include a first portion that extends on the surface of enclosure 321, and a second portion that extends to the inside of enclosure 321 and electrically couples to pad 221. Redistribution body 420 may include a first portion that extends on the surface of enclosure 321, a second portion that extends from the surface of enclosure 321 to the second surface of substrate 120, and a third portion that extends on the second surface of substrate 120. The third portion can be partially exposed on the surface of stacked package structure 20 in order to provide outer pins for electrically coupling the electrodes on the active face of die 220 to external circuitry. Penetrating body 520 may have a first terminal that extends on the surface of enclosure 321, a second terminal that extends on the second surface of substrate 120, and a mid-section that extends from the surface of enclosure 321 to the second surface of substrate 120.

Die 620 may be fabricated in stacked package structure 20 in substantially the same way. For example, die 620 can be flip-chip mounted (e.g., electrically coupled by conductive bumps) or be front-chip mounted (e.g., electrically coupled by conductive wires). Also, electrodes on die 620 can be electrically coupled to the first terminal of penetrating body 520 via conductive bumps 621 or conductive wires. The second terminal of penetrating body 520 can be partially exposed on the surface of stacked package structure 20, in order to provide outer pins for electrically coupling the electrodes on the active face of die 620 to external circuitry. At least one electrode of die 620 may be electrically coupled to the first portion of the interlinkage 320 via conductive bumps 621 or conductive wires. In the example of FIG. 2, chip 620 is flip-chip mounted, thus the electrodes of die 220 and die 620 are electrically coupled inside stacked package structure 20.

Redistribution body 720 may include a first portion that extends on the second surface of substrate 120, and a second portion that extends from the second surface of substrate 120 to the surface of conducting layer 521, and may be electrically coupled to the electrodes on the back face of die 22. The first portion of redistribution body 720 can be partially exposed on the surface of stacked package structure 20, in order to provide outer pins for electrically coupling the electrodes on the back face of die 220 to external circuitry. In this example, the second portion of redistribution body 420 can include a first conducting channel that extends from the surface of enclosure 321 to the surface of conducting layer 521, and a second conducting channel that extends from the surface of conducting layer 521 to the second surface of substrate 120. The mid-section of penetrating body 520 may include a third conducting channel that extends from the surface of enclosure 321 to conducting layer 521, and another conducting layer that extends from the surface of conducting layer 521 to the second surface of substrate 120.

In this example, the first and second portions of interlinkages 320, the first portion and the first conducting channel of redistribution body 420, the first terminal and the third conducting channel of penetrating body 520 may be formed by patterned conducting layer 42. Conducting layer 42 may include a first portion that extends on the surface of enclosure 321, a second portion that extends from the surface of enclosure 321 to pad 221, and a third portion that extends from the surface of enclosure 321 to the surface of conducting layer 521.

For example, a method of forming conducting layer 42 can include forming a plurality of first openings that extends from the surface of enclosure 321 to pads 221 and a plurality of second openings that extends from the surface of enclosure 321 to the surface of conducting layer 521 by laser etching or mechanical drilling the surface of enclosure 321. The method can also include forming the conducting material layer by plating or depositing on the surface of enclosure 321, the first openings and the second openings, and etching the conducting material layer by a mask, so as to obtain patterned conducting layer 42. The second conducting channel, the fourth conducting channel, and the second portion of redistribution body 720 may be formed before conducting layer 42.

The second conducting channel, the fourth conducting channel, and the second portion of redistribution body 720 can be made from the same conducting material 522 at substantially the same time. This can include forming patterned conducting layer 521 on the first surface of substrate 120, and forming patterned conducting layer 52 as the outer pins of stacked package structure 20 before die 220 can be mounted to substrate 120. Thus, conducting layer 52 may include the third portion of redistribution body 420, the second terminal of penetrating body 520, and the first portion of the second redistribution body. The method can also include forming a plurality of openings that extends from the surface of conducting layer 521 to the second surface of substrate 120 by conducting the opening process on the surface of conducting layer 521. The method can also include forming the second conducting channel, the fourth conducting channel, and the second portion of redistribution body 720, which are electrically coupled to parts of patterned conducting layer 52 by filling or depositing the conducting material in the openings.

In this particular example, conducting layer 42 may include metal layer 421 that extends on the surface of enclosure 321 for thickening conducting layer 42. Conducting layer 42 may also include metal layer 422 disposed on the surface of metal layer 421, and inside the first and second openings, as well as metal layer 423 disposed on metal layer 422. Metal layer 422 may be formed by a metal seed layer of the metal layer 423 formed by plating. Conducting layer 52 may include metal layer 523 disposed on the second surface of substrate 120, and solder layer 524 disposed on metal layer 523. This particular example may be suitable for packaging the first die with electrodes on the back face. In such a case, the electrodes on the back face of the first die can be lead out via the second redistribution body, in order to provide outer pins for electrically coupling to external circuitry.

Figure 3:
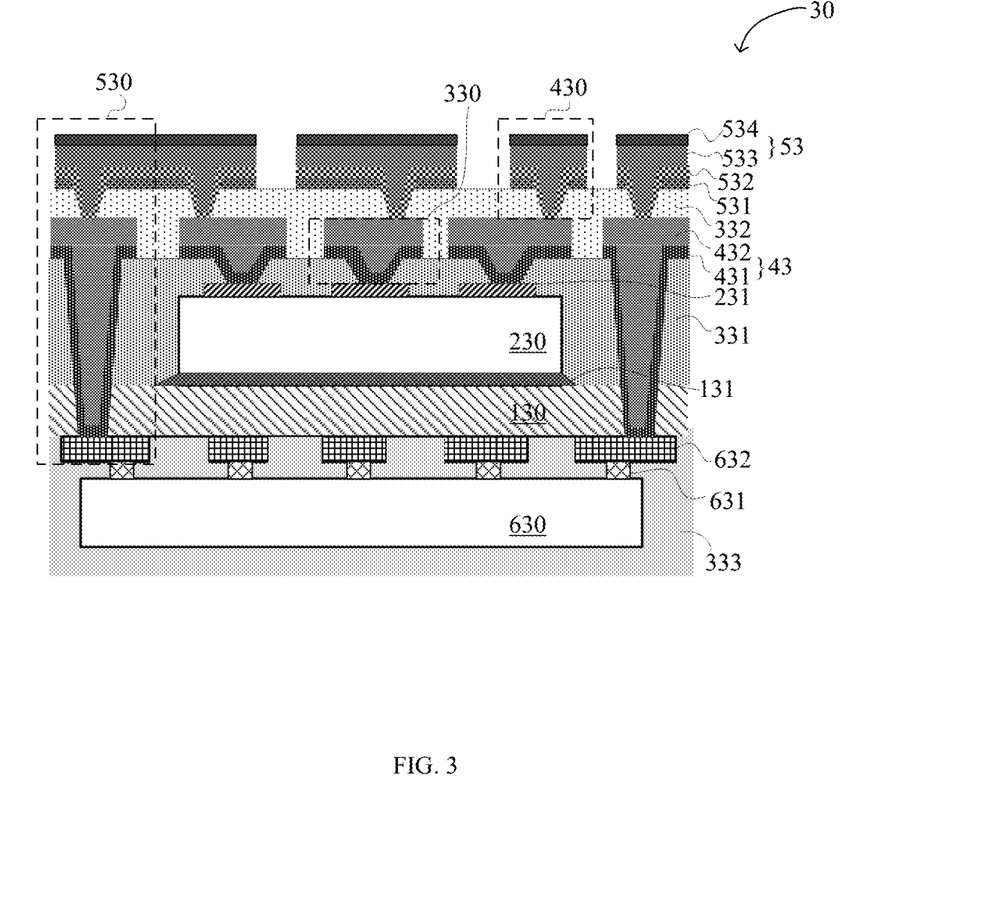
FIG. 3 is a cross-sectional view diagram of a third example stacked package structure, in accordance with embodiments of the present invention.

Referring now to FIG. 3, shown is a cross-sectional view diagram of a third example stacked package structure, in accordance with embodiments of the present invention. Stacked package structure 30 may include package substrate 130, die 230, adhesive layer 131, spaced interlinkages 330, enclosure 331, spaced redistribution bodies 430, spaced penetrating bodies 530, enclosure 322, die 630, and enclosure 333. The back face of die 230 may be mounted to a first surface of substrate 130 that also has a second surface opposite thereto. Enclosure 331 may cover die 230. Interlinkage 330 may include a first portion that extends on the surface of enclosure 331, and a second portion that extends from the surface of enclosure 331 to pads 231 on the active face of die 230. The first portion of interlinkage 330 can be partially exposed on the surface of stacked package structure 30, in order to provide pins for electrically coupling die 230 to external circuitry. Enclosure 332 may cover interlinkage 330, in order to protect interlinkage 330 from possibly being damaged or polluted.

Redistribution body 430 may include a first portion that extends on the surface of enclosure 332, and a second portion that extends from the surface of enclosure 332 to the inside and may be electrically coupled with the first portion of interlinkage 430. Penetrating body 530 may have a first terminal that extends on the second surface of substrate 130, a second terminal including a first portion that extends on the surface of enclosure 332 and a second portion that extends to the inside of enclosure 332, and a mid-section that extends from the second terminal of penetrating body 530 to the second surface of substrate 130 and is electrically coupled to the first terminal of penetrating body 530. In this particular example, the mid-section of penetrating body 530 may further include a first portion that extends on the surface of the first enclosure and a second portion that extends on the second surface of substrate 130.

Interlinkage 330 and the mid-section of the penetrating body can be formed by patterned conducting layer 43. Conducting layer 43 may include a first portion that extends on the surface of enclosure 331, a second portion that extends from the surface of enclosure 331 to pad 231, and a third portion that extends from the surface of enclosure 331 to the second surface of substrate 130. The process of forming patterned conducting layer 43 may include forming a plurality of first openings that extends from the surface of enclosure 331 to the pads 231, and a plurality of second openings that extends from the surface of enclosure 331 to the second surface of substrate 130 by conducting opening process on the surface of enclosure 331 by laser etching or mechanical drilling. The second openings can be terminated at patterned conducting layer 632 on the second surface of substrate 130. The process can also include forming the conducting material layer by plating or depositing on the surface of enclosure 331, the first opening and the second opening. The process can also include forming patterned conducting layer 43 by etching the conducting material layer by a mask. Conducting layer 43 may include metal layer 431 formed by plating the seed layer and metal layer 432 on metal layer 431.

Conducting layer 632 may be formed on the second surface of substrate 130, in order to serve as the first terminal of penetrating body 530. The active face of die 630 can be facing toward conducting layer 632, and electrodes on the active face of die 630 can be electrically coupled to the conducting regions of patterned conducting layer 632 via conductive bumps 631, so that the electrodes of die 630 are lead to conducting layer 632, and further to the second terminal of penetrating body 530 through the mid-section of penetrating body 530, where the conducting regions are isolated from each other. The second terminal of penetrating body 530 may be partially exposed on the surface of stacked package structure 30, in order to provide outer pins for electrically coupling die 630 to external circuitry.

Die 630 may also be packaged in the way of wire bonding, such as where the back face of die 630 may be pasted to conducting layer 632 by insulating glue. The electrodes on die 630 can be electrically coupled to the first terminal (e.g., conducting layer 632) of penetrating body 530 via conductive wires such that the electrodes on die 630 are lead to the surface of the stacked package structure through the second terminal of penetrating body 530, in order to provide outer pins for electrically coupling to external circuitry. In addition, in stacked package structure 30, the first portion of redistribution body 430 can be electrically coupled to the second terminal of penetrating body 530, so as to electrically couple die 130 to die 630, in order to reduce the number of pins of stacked package structure 30. For example, the first portion of redistribution body 430 may extend to the second terminal of penetrating body 530 to establish electrical connectivity therebetween.

In this particular example, redistribution body 430 and the second terminal of penetrating body 530 can be formed by patterned conducting layer 53. Conducting layer 53 may include a first portion that extends on the surface of enclosure 332, a second portion that extends to the inside of enclosure 332 and electrically couples to the mid-section of penetrating body 530 and the first portion of interlinkage 430. The method of forming conducting layer 53 may include forming a plurality of openings that extends to interlinkage 430 and a plurality of openings that extends to the mid-section of penetrating body 530 by conducting opening process on the surface of enclosure 332 by laser etching or mechanical drilling. The method can also include forming the conducting material layer by plating or depositing on surface of enclosure 332 and in the openings, and forming patterned conducting layer 53 by etching the conducting material layer with a mask.

Conducting layer 53 may include metal layer 531 that extends on the surface of enclosure 332, where metal layer 531 serves as a thicker layer of conducting layer 53. Conducting layer 53 may also include metal layer 532 disposed on metal layer 531 and in the openings of enclosure 332, and metal layer 533 disposed on metal layer 532. Metal layer 532 may serve as a metal seed layer for forming metal layer 533 by plating. In addition, conducting layer 53 may also include solder layer 534 disposed on metal layer 553. Enclosure 333 may cover die 630, in order to protect die 630 from possibly being damaged or polluted.

Thus in certain embodiments, the stacked package structure may be adapted to a chip package with a relatively high space density between pads, by firstly leading out the electrodes via the interlinkage and the first redistribution body when packaging the first die. In such a case, the bonding wires may not be needed and the package resistors can be reduced. By secondly leading out the electrodes on the second die via the penetrating bodies that penetrate the first enclosure and the substrate in a similar way after packaging the first die, the chip can be packaged in a stack with a reduced packaging size and fewer pins.

Figure 4:
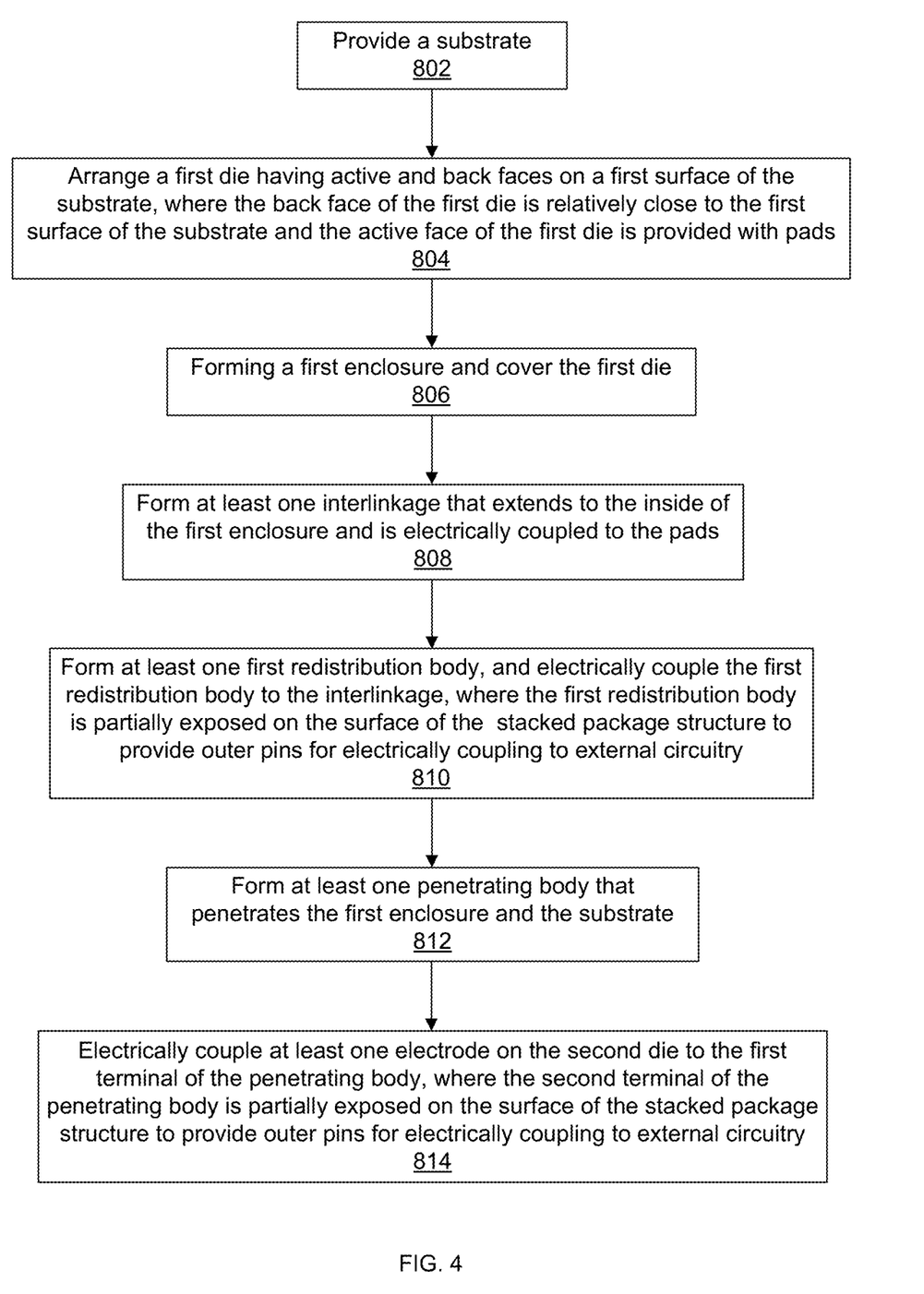
FIG. 4 is a flow diagram of an example method of making a stacked package structure, in accordance with embodiments of the present invention.

Referring now to FIG. 4, shown is a flow diagram of an example method of making a stacked package structure, in accordance with embodiments of the present invention. At

802, a substrate can be provided. At 804, a first die can be arranged on a first surface of the substrate. The first die may have an active face and a back face opposite thereto. The back face of the first die can be relatively close to the first surface of the substrate, and the active face of the first die may be provided with pads. At 806, a first enclosure can be formed and may cover the first die.

At 808, at least one interlinkage can be formed. The interlinkage can extend to the inside of the first enclosure, and may be electrically coupled to the pads. At 810, at least one first redistribution body can be formed, and the first redistribution body can be electrically coupled to the interlinkage. Also, the first redistribution body can be partially exposed on the surface of the surface of the stacked package structure, in order to provide outer pins for electrically coupling to external circuitry. At 812, at least one penetrating body can be formed. The penetrating body can penetrate the first enclosure and the substrate. At 814, at least one electrode on the second die can be electrically coupled to the first terminal of the penetrating body. Also, the second terminal of the penetrating body may be partially exposed on the surface of the stacked package structure, in order to provide outer pins for electrically coupling to external circuitry.

In particular embodiments, the stacked package structure can be adapted to a chip package with a relatively high space density between pads, by firstly leading out the electrodes via the interlinkages and the first redistribution bodies when packaging the first die. In such a case, the bonding wires may not be needed and the package resistors can be reduced. Secondly, by leading out the electrodes on the second die via the penetrating bodies that penetrate the first enclosure and the substrate after packaging the first die, the chip can be packaged in a stacked configuration with reduced packaging size and fewer pins.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A stacked package structure, comprising:
   a) a substrate having a first surface and a second surface opposite thereto;
   b) a first die having an active face and a back face opposite thereto, wherein said first die is arranged above said first surface of said substrate such that said substrate supports said first die, said back face of said first die is bonded to said first surface of said substrate by only an adhesive layer, and said active face of said first die comprises pads;
   c) a first enclosure that together with said adhesive layer encapsulates said first die;
   d) at least one interlinkage that extends to said first enclosure to electrically couple to said pads;
   e) at least one first redistribution body electrically coupled to said interlinkage, and being partially exposed on a surface of said stacked package structure to provide outer pins for electrically coupling to printed-circuit board (PCB) external circuitry;
   f) at least one penetrating body that penetrates said first enclosure and said substrate;
   g) a second die having at least one electrode electrically coupled to a first terminal of said penetrating body, wherein said second die is arranged below said second surface of said substrate, said second die comprises an active face and a back face opposite thereto, said active face of said second die is closer than said back face of said second die to said second surface of said substrate, said active face of said second die comprises at least one electrode, and each said electrode on said second die is not electrically coupled to said back face of said first die; and
   h) a second terminal of said penetrating body that is at least partially exposed on said surface of said stacked package structure to provide said outer pins for electrically coupling to said external circuitry, wherein each of said outer pins comprises a solder layer on a metal layer, wherein a vertical thickness of said metal layer is greater than a vertical thickness of said solder layer, and wherein said vertical thickness of said metal layer is predetermined such that said output pins are configured to be electrically and directly connected to said PCB external circuitry.

2. The stacked package structure of claim 1, wherein said interlinkage comprises a first portion that extends on a surface of said first enclosure, and a second portion in said first enclosure and that extends to a corresponding pad.

3. The stacked package structure of claim 2, wherein said first redistribution body comprises:
   a) a first portion that extends from said surface of said first enclosure to said interlinkage and electrically couples to said interlinkage;
   b) a second portion extending from a surface of said first enclosure to a second surface of said substrate; and
   c) a third portion extending on said second surface of said substrate, wherein said first portion of said first redistribution body extends to said first portion of said interlinkage and is electrically coupled to said interlinkage, said third portion of said first redistribution is partially exposed on said surface of said stacked package structure, to provide outer pins for electrically coupling to said external circuitry, said penetrating body comprises a first terminal that extends on said surface of said first enclosure, a second terminal that extends on said second surface of said substrate, and a mid-section that extends from said surface of said first enclosure to said second surface of said substrate.

4. The stacked package structure of claim 3, wherein:
   a) said active face of said second die faces toward said first enclosure, and at least one electrode of said second die is electrically coupled to said first terminal of said penetrating body through conductive bumps; and
   b) said at least one electrode on said second die is electrically coupled to said first portion of said interlinkage through said conductive bumps.

5. The stacked package structure of claim 3, wherein:
   a) said second die comprises a back face and an active face opposite thereto, said back face of said second die being above and separated from said first portion of said interlinkage by a conductive bump, and at least one electrode on said active face of said second die being electrically coupled to said first terminal of said penetrating body via conductive wires; and
   b) said at least one electrode on said active face is electrically coupled to said first portion of said interlinkage.

6. The stacked package structure of claim 3, wherein said interlinkage, said first terminal and said mid-section of said penetrating body, said first and said second portions of said first redistribution body are formed by a patterned first conducting layer comprising a first portion that extends above said first enclosure, a second portion that extends from said surface of said first enclosure to said pad, and a third portion that extends from said surface of said first enclosure to said second surface of said substrate.

7. The stacked package structure of claim 3, wherein said metal layer comprises a thickening metal layer.

8. The stacked package structure of claim 3, further comprising a second enclosure that encapsulates said second die.

9. The stacked package structure of claim 2, further comprising:
   a) a second enclosure that covers said interlinkage;
   b) said penetrating body having a first terminal that extends on said second surface of said substrate, a second terminal having a first portion that extends on said surface of said second enclosure and a second portion that extends to the inside of said second enclosure, and a mid-section that extends from said second terminal of said penetrating body to said second surface of said substrate;
   c) said first redistribution body comprises a first portion that extends on said surface of said second enclosure, and a second portion that extends to the inside of said second enclosure and is electrically coupled to said interlinkage; and
   d) said first portion of said first redistribution is partially exposed on said surface of said stacked package structure to provide outer pins for electrically coupling to said external circuitry.

10. The stacked package structure of claim 9, wherein said active face of said second die faces toward said second surface of said substrate, and at least one electrode on said second die is electrically coupled to said first terminal of said penetrating body via conductive bumps.

11. The stacked package structure of claim 9, wherein said second die comprises a back face and an active face opposite thereto, said back face of said second die being separated from said first terminal of said interlinkage by a conductive bump, and at least one electrode on said active face of said second die being electrically coupled to said first terminal of said penetrating body via conductive wires.

12. The stacked package structure of claim 9, wherein at least one second terminal of said penetrating body extends to said first portion of said first redistribution body to electrically couple to said first redistribution body.

13. The stacked package structure of claim 9, wherein:
   a) said mid-section of said penetrating body comprises a first portion that extends on surface of said first enclosure and a second portion that extends to said second surface of said substrate, said mid-section of said penetrating body and said interlinkage being formed by a patterned first conducting layer, said patterned first conducting layer comprises a first portion that extends on said first enclosure, a second portion that extends from said surface of said first enclosure to said pad, and a third portion that extends from said surface of said first enclosure to said second surface of said substrate; and
   b) said patterned first conducting layer comprises a first metal layer, and a second metal layer disposed on said first metal layer.

14. The stacked package structure of claim 9, wherein said second terminal of said penetrating body and said first redistribution body are formed by a patterned second conducting layer, said second conducting layer comprising a first portion that extends on said surface of said second enclosure, and a second portion that extends to the inside of said second enclosure.

15. The stacked package structure of claim 14, wherein:
   a) said patterned second conducting layer comprises a third metal layer and a fourth metal layer disposed on said third metal layer, and a solder layer disposed on said surface of said fourth metal layer; and
   b) said patterned second conducting layer further comprises a thicker layer under said third metal layer, wherein said thicker layer extends on said surface of said second enclosure.

16. The stacked package structure of claim 9, wherein said first terminal of said penetrating body is formed by said patterned third conducting layer, and further comprising a third enclosure for covering said second die.

17. A method of making a stacked package structure, the method comprising:
   a) providing a substrate having a first surface and a second surface opposite thereto;
   b) arranging a first die on said first surface of said substrate such that said substrate supports said first die, wherein said first die comprises an active face and a back face opposite thereto, said back face of said first die is bonded to said first surface of said substrate by only an adhesive layer, and said active face of said first die comprises pads;
   c) forming a first enclosure to, together with said adhesive layer, encapsulate said first die;
   d) forming at least one interlinkage that extends to the inside of said first enclosure and is electrically coupled to said pads;
   e) forming at least one first redistribution body, and electrically coupling said first redistribution body to said interlinkage, wherein said first redistribution body is partially exposed on said surface of said stacked package structure to provide outer pins for electrically coupling to printed-circuit board (PCB) external circuitry;
   f) forming at least one penetrating body that penetrates said first enclosure and said substrate; and
   g) electrically coupling at least one electrode on a second die to a first terminal of said penetrating body, wherein a second terminal of said penetrating body is partially exposed on said surface of said stacked package structure to provide said outer pins, wherein each of said outer pins comprises a solder layer on a metal layer, wherein a vertical thickness of said metal layer is greater than a vertical thickness of said solder layer, and wherein said vertical thickness of said metal layer is predetermined such that said output pins are configured to be electrically and directly connected to said PCB external circuitry,
   h) wherein said second die is arranged below said second surface of said substrate, said second die comprises an active face and a back face opposite thereto, said active face of said second die is closer than said back face of said second die to said second surface of said substrate, said active face of said second die comprises at least one electrode, and each said electrode on said second die is not electrically coupled to said back face of said first die.

18. The method of claim 17, wherein said at least one first redistribution body is partially exposed on said surface of said stacked package structure in a region that is not covered by said first die.

19. The stacked package structure of claim 1, wherein said at least one first redistribution body is partially exposed on said surface of said stacked package structure in a region that is not covered by said first die.

* * * * *